(12) United States Patent
Gunderson

(10) Patent No.: US 7,599,147 B2
(45) Date of Patent: Oct. 6, 2009

(54) ELECTRICAL FEEDTHROUGH ASSEMBLY WITH ELASTIC RING INTERFACE

(75) Inventor: Neal F. Gunderson, Lake Elmo, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 720 days.

(21) Appl. No.: 11/198,505

(22) Filed: Aug. 5, 2005

(65) Prior Publication Data

US 2007/0032833 A1    Feb. 8, 2007

(51) Int. Cl.
    *G11B 33/14*    (2006.01)
(52) U.S. Cl. ................................... 360/97.02
(58) Field of Classification Search .............. 360/97.02; 720/648
    See application file for complete search history.

(56) References Cited

U.S. PATENT DOCUMENTS

| | | | |
|---|---|---|---|
| 4,367,503 A | 1/1983 | Treseder | |
| 4,488,192 A | 12/1984 | Treseder | |
| 4,556,969 A | 12/1985 | Treseder et al. | |
| 5,029,027 A * | 7/1991 | Sleger | 360/97.03 |
| 5,097,164 A | 3/1992 | Nakasugi et al. | |
| 5,317,462 A | 5/1994 | Kakizaki et al. | |
| 5,422,766 A | 6/1995 | Hack et al. | |
| 5,454,157 A | 10/1995 | Ananth et al. | |
| 5,559,382 A | 9/1996 | Oku et al. | |
| 5,671,103 A | 9/1997 | Tada | |
| 5,696,648 A | 12/1997 | Jeong et al. | |
| 5,791,784 A | 8/1998 | Ichiyama | |
| 5,793,566 A | 8/1998 | Icura et al. | |
| 5,969,901 A * | 10/1999 | Eckberg et al. | 360/97.01 |
| 6,078,475 A | 6/2000 | Lawson | |
| 6,096,979 A * | 8/2000 | Kyle | 174/152 GM |
| 6,144,178 A | 11/2000 | Hirano et al. | |
| 6,178,059 B1 | 1/2001 | Frees | |
| 6,317,286 B1 | 11/2001 | Murphy et al. | |
| 6,373,654 B1 | 4/2002 | Iwahara et al. | |
| 6,392,838 B1 | 5/2002 | Hearn et al. | |
| 6,411,471 B1 | 6/2002 | Liu et al. | |
| 6,430,000 B1 | 8/2002 | Rent | |
| 6,525,899 B2 | 2/2003 | Hearn et al. | |
| 6,970,322 B2 * | 11/2005 | Bernett | 360/97.01 |
| 2002/0044376 A1 | 4/2002 | Serigawa et al. | |
| 2002/0089782 A1 | 7/2002 | Hearn et al. | |
| 2002/0114104 A1 | 8/2002 | Hearn et al. | |
| 2002/0153672 A1 | 10/2002 | Caplain et al. | |
| 2003/0179489 A1 | 9/2003 | Bernett et al. | |

* cited by examiner

*Primary Examiner*—Julie Anne Watko
(74) *Attorney, Agent, or Firm*—Fellers, Snider, et al.

(57)    ABSTRACT

Apparatus for providing a low permeable interface in a hermetically sealed housing. The housing includes a substantially planar housing member with an aperture extending therethrough. An electrical feedthrough assembly extends adjacent the aperture to provide one or more electrical signal transmission paths. An elastic ring couples a peripheral edge of the electrical feedthrough assembly to the housing member to form a low permeable interface therebetween. The ring preferably operates to compensate for the differential between the coefficients of thermal expansion of the feedthrough assembly and the housing member. The ring is preferably provided with an elongated cross-sectional shape with a segment that extends in a direction non-parallel to a longitudinal axis of the feedthrough assembly, thereby enhancing the spring characteristics of the ring. The housing is preferably characterized as a housing of a data storage device, and retains an inert gas atmosphere, such as at least 95% (w/w) helium.

23 Claims, 3 Drawing Sheets

ELECTRICAL FEEDTHROUGH ASSEMBLY WITH ELASTIC RING INTERFACE

FIELD OF THE INVENTION

The claimed invention relates generally to the field of hermetically sealed housings and more particularly, but not by way of limitation, to an electrical feedthrough assembly for a housing member with an elastic ring interface.

BACKGROUND

Hermetically sealed housings are useful in a wide variety of applications. A hermetically sealed housing is generally configured to prevent fluidic transfer between the interior and the exterior of the housing.

One particular area where hermetically sealed housings have been proposed is in the field of data storage devices, which are used to store and retrieve large amounts of user data in a fast and efficient manner. Such devices generally include an internally supported data storage medium, which may be accessed by a moveable data transducer or by another access methodology.

The use of a hermetically sealed housing in a data storage device advantageously allows the use of a lower density fluid within the housing, such as an inert gas (e.g., helium). This can provide certain operational performance advantages including lower data transducer fly heights, reduced nonrepeatable runout (NRRO) effects, and higher data recording densities.

A hermetically sealed housing can also reduce corrosion of internal components and contamination from external particles. Thus, such a housing can be advantageous even if the data storage device has no internal moving parts.

There is accordingly a need for improvements in hermetically sealed housings, such as a housing of a data storage device, and it is to such improvements that the claimed invention is generally directed.

SUMMARY OF THE INVENTION

Preferred embodiments of the present invention are generally directed to an apparatus for providing a low permeable interface in a hermetically sealed housing.

In accordance with preferred embodiments, the housing includes a substantially planar housing member with an aperture extending therethrough. An electrical feedthrough assembly extends adjacent the aperture to provide one or more electrical signal transmission paths between the interior of the housing and an external device.

An elastic ring couples a peripheral edge of the electrical feedthrough assembly to the housing member to form a low permeable interface therebetween. The ring preferably operates to compensate for the differential, if any, between the coefficients of thermal expansion of the feedthrough assembly and the housing member.

The ring is preferably provided with an elongated cross-sectional shape with a segment that extends in a direction non-parallel to a longitudinal axis of the feedthrough assembly, thereby enhancing the spring characteristics of the ring.

The housing is preferably characterized as a housing of a data storage device, and retains an inert gas atmosphere such as at least 95% (w/w) helium.

These and various other features and advantages which characterize the claimed invention will become apparent upon reading the following detailed description and upon reviewing the associated drawings.

DETAILED DESCRIPTION

Figure 1:
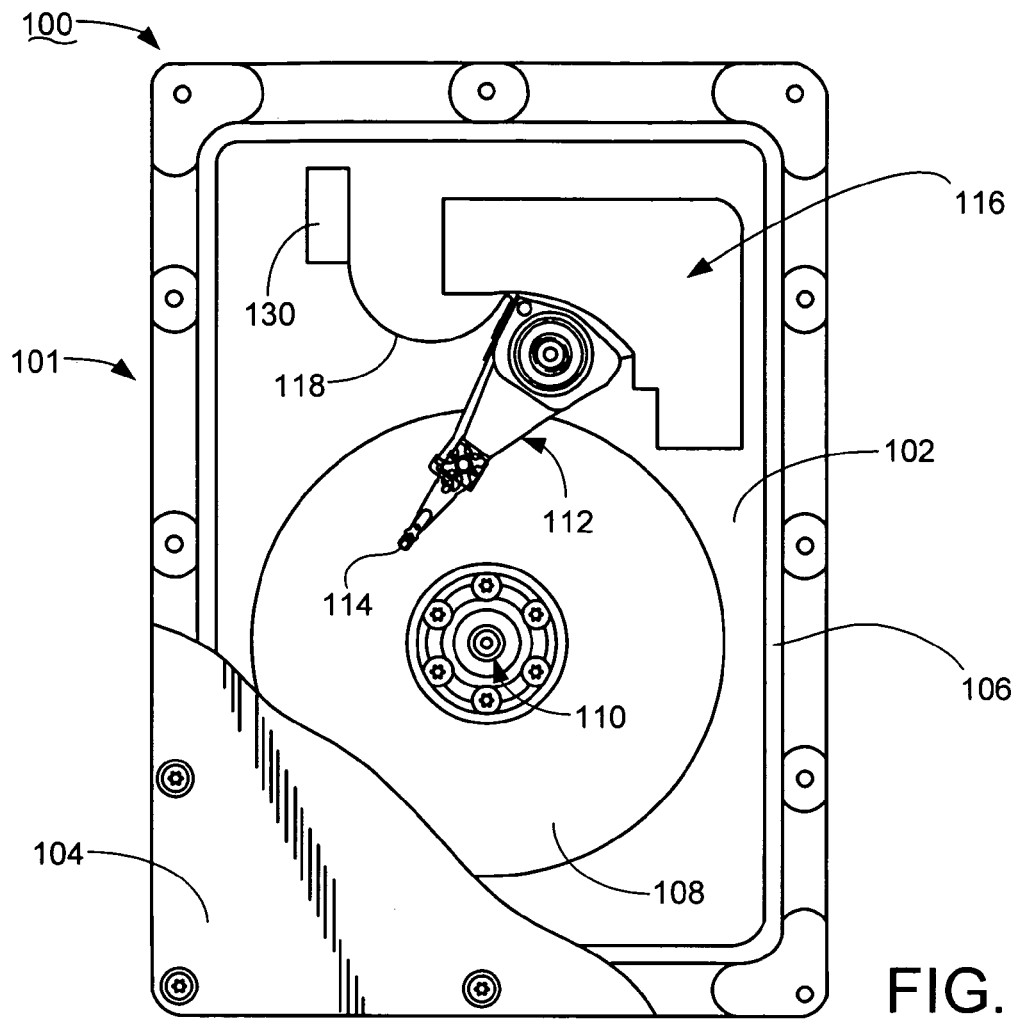
FIG. 1 is a top plan view of a data storage device having a hermetically sealed housing constructed in accordance with preferred embodiments of the present invention.

To illustrate an exemplary environment in which presently preferred embodiments of the present invention can be advantageously practiced, FIG. 1 shows a data storage device 100 of the type configured to store and retrieve digital data in a computer environment.

The device 100 is preferably characterized as a disc drive. The device 100 includes a hermetically sealed housing 101 formed from a base deck 102 and top cover 104 (the latter of which is shown in partial cut-away). The base deck 102 and top cover 104, also referred to herein as "housing members," compress a gasket 106 to effect a hermetic seal.

The housing 101 is preferably supplied with an inert fluidic atmosphere (e.g., helium) at a selected atmospheric pressure, such as standard atmospheric pressure, or pressures above or below standard atmospheric pressure. For purposes of the present discussion, it will be contemplated that the interior atmosphere comprises at least 95% by weight (w/w) helium.

It is contemplated that the hermetically sealed housing 101 will be substantially impervious to the ingress of external fluids and contaminants, as well as to the egress of the internally retained atmosphere, for the operational life of the device 100 (e.g., a number of years). When using an internal helium atmosphere as preferred herein, it has been found to be generally more difficult to retain the smaller helium molecules within the enclosure as compared to keeping out the larger air molecules and contaminant particles from the surrounding atmosphere. Helium is particularly soluble and can easily pass through certain types of materials, and is more readily retained by others. Thus, as explained below it is desirable to select particularly impermeable materials suitable for the associated atmospheric composition.

One or more data storage media 108 (discs) are internally supported and rotated by a spindle motor 110 at a constant high speed. A moveable actuator 112 supports a corresponding array of data transducers 114 (heads) to write data to and read data from tracks (not shown) defined on the media surfaces.

The transducers 114 are hydrodynamically supported by fluidic currents established by the high speed rotation of the media 108 during operation of the device 100. A voice coil motor 116 pivots the actuator 112 to move the transducers 114 adjacent tracks (not shown) on the media surfaces.

A flex circuit assembly 118 forms a portion of an electrical communication path between the actuator 112 and a printed circuit board (PCB) of the device 100. The PCB is not visible in FIG. 1, but it will be understood that the PCB is preferably mounted to the underside of the base deck 102 and supports communication and control circuitry for the device 100. However, other PCB mounting arrangements, including within the housing 101, are explicitly contemplated.

Figure 2:
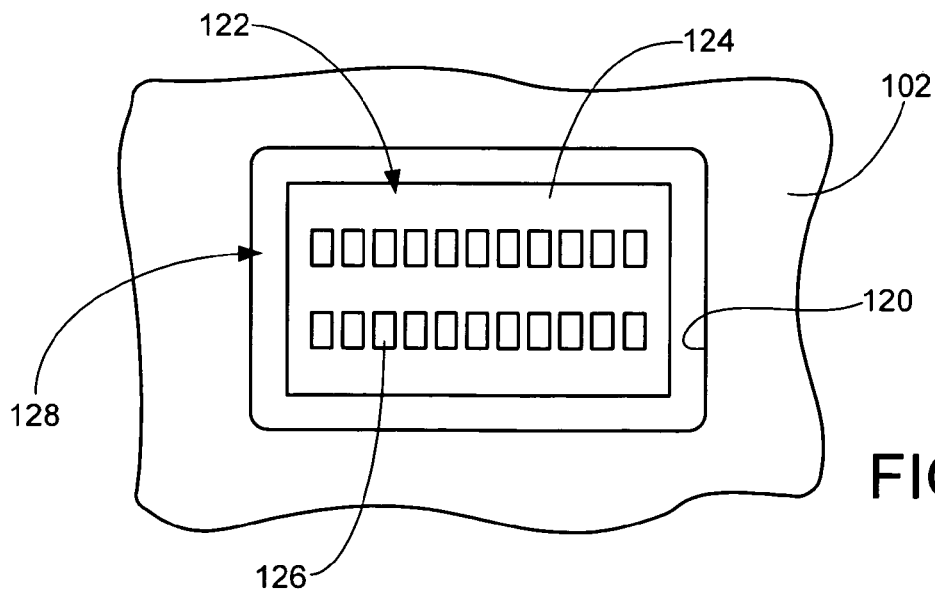
FIG. 2 provides a preferred configuration for an electrical feedthrough assembly and elastic ring of the device of FIG. 1.

FIG. 2 provides a bottom plan view of relevant portions of the base deck 102. An annular sidewall 120 extends through the base deck 102 to form an aperture therethrough. An electrical feedthrough assembly 122 extends adjacent the aperture. The electrical feedthrough assembly 122 preferably mates with the flex circuit assembly 118 to establish a number of electrical signal connections through the housing 101.

The assembly 122 preferably comprises a substrate 124 through which a plurality of individual electrically conductive feedthroughs 126 extend (in this case, 22, although other numbers can be used). The signals carried by the feedthroughs 126 can be data signals including differential signals across adjacent pairs of the feedthroughs, power voltage signals, reference ground plane signals, etc.

In some preferred embodiments, the substrate 124 comprises a low permeable, electrically insulative material such as a suitable ceramic, glass, polyimide film, FR4 epoxy laminate, thick film, etc. In other preferred embodiments, the substrate 124 comprises a low permeable, electrically conductive material such as aluminum, steel, metal alloy, etc. For purposes of the present discussion, it will be contemplated that the substrate 124 is formed from low temperature cofired ceramic (LTCC).

The feedthroughs 126 can take any number of desired configurations depending upon the requirements of a given application. Preferred alternatives include filled or sealed plated-through-holes (PTHs), and pins that extend through the substrate 124 (including pins that extend above and below the substrate). With the plated-through-holes, the holes can be offset in two different layers with a plated trace in between layers, connecting the two holes. It will be noted that an annular insulator, such as a glass cylinder, may be advantageously used to surround each feedthrough 126 if an electrically conductive substrate 124 is utilized.

Although not required, it is contemplated that the feedthrough assembly 122 will have a coefficient of thermal expansion that is different from a coefficient of thermal expansion of the base deck 102. For example, if the substrate 124 is formed of ceramic, and the base deck 102 is formed of metal (such as aluminum), then coefficient of thermal expansion of the feedthrough assembly may be significantly lower than the coefficient of thermal expansion of the base deck 102.

Accordingly, FIG. 2 further generally depicts an elastic ring 128 which is interposed between the feedthrough assembly 122 and the base deck 102. As explained below, the elastic ring 128 preferably operates to couple a peripheral edge of the feedthrough assembly 122 to the base deck 102, as well as to accommodate the difference, if any, in the respective coefficients of thermal expansion of the base deck 102 and the feedthrough assembly 122. This maintains a low permeable interface between these respective members.

Figure 3:
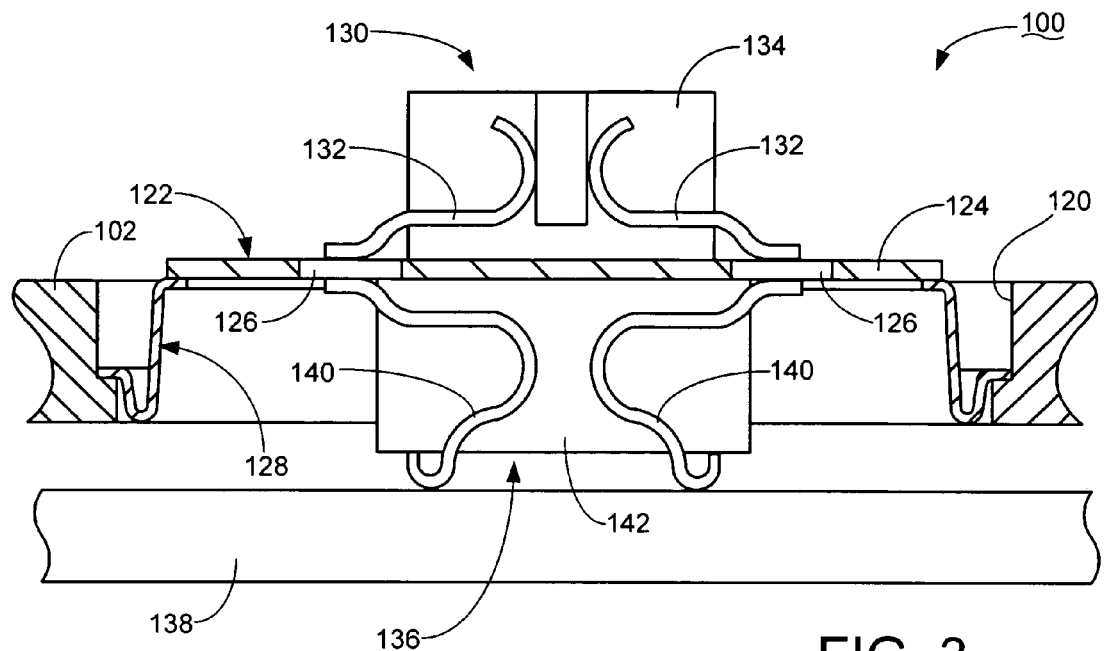
FIG. 3 provides an elevational, cross-sectional representation of the electrical feedthrough assembly and elastic ring of FIG. 2 in conjunction with mating connectors to establish an electrical signal transmission path between an interior of the device housing and an externally mounted printed circuit board (PCB) of the device.

A first preferred configuration for the elastic ring 128 is set forth generally in FIG. 3, which provides an elevational representation of relevant portions of the device 100. A flex circuit connector 130 (also depicted in FIG. 1) includes a plurality of spring contacts 132 supported within a housing 134. These contacts 132 respectively bear against, or are attached to, the feedthroughs 126 as shown.

A PCB connector 136 is coupled to the aforementioned PCB (numerically denoted in FIG. 3 at 138), and similarly includes a number of spring contacts 140 supported by a housing 142. The contacts 140 bear against, or are attached to, the feedthroughs 126 on the bottom side of the assembly 122 opposite that of the contacts 132. The respective connector configurations in FIG. 3 are merely illustrative, so that any number of different configurations can readily be used depending upon the requirements of a given application.

Figure 4:
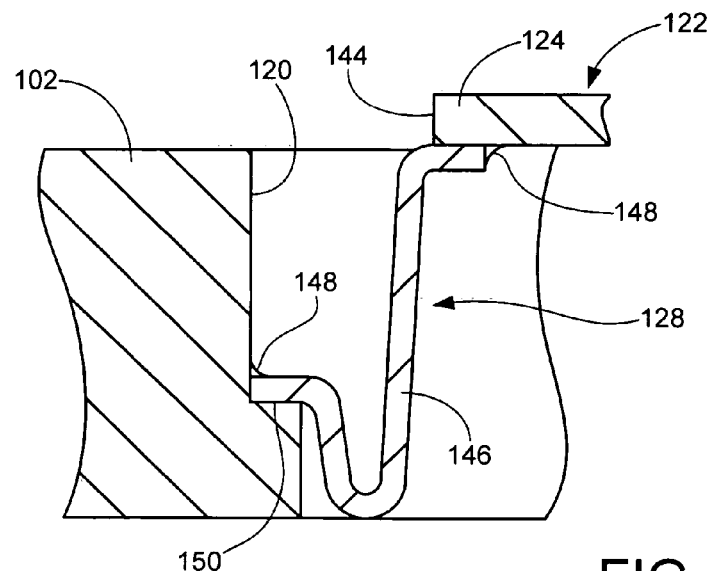
FIG. 4 shows the elastic ring of FIG. 3 in greater detail.

As shown in greater detail in FIG. 4, the elastic ring 128 couples a peripheral edge 144 of the feedthrough assembly 122 to the sidewall 120 of the base deck 102 to effect a low permeable interface. The ring 128 can be formed from any number of elastic materials, such as but not limited to metals such as aluminum, steel, nickel, copper, brass, etc. A particularly preferred material for the ring 128 is an iron based alloy comprising nickel and cobalt, commercially available under the trademark Kovar® from Westinghouse Electric & Manufacturing Company, Pittsburgh, Pa., USA.

Preferably, the elastic ring 128 is provided with a coefficient of thermal expansion that is between the respective coefficients of the base deck 102 and the assembly 122 in order to help alleviate thermal stresses encountered by the housing 101. However the ring 128 can alternatively be provided with a coefficient that matches the coefficient of the base deck 102 or the assembly 122, as desired.

The ring 128 is further preferably provided with an elongated cross-sectional shape, such as the substantially S-shape shown in FIGS. 3 and 4. This provides at least one segment, such as 146, that extends in a direction that is non-parallel with the longitudinal axis of the feedthrough assembly 122 (the latter of which extends horizontally in FIGS. 3 and 4). This enhances the spring characteristics of the ring 128 by permitting deflection of the cross-sectional shape of the ring 128 during temperature cycling, after which the ring returns to its original shape.

Attachment of the ring 128 can be carried out in a number ways, such as soldering (brazing). Soldering is particularly advantageous since metals generally have very low permeability to helium and other inert gases. Solder joints are numerically denoted at 148 in FIG. 4. It may be desirable to plate or otherwise prepare the respective surfaces of the base deck 102 and the substrate 124 to accept the soldering operation.

In a particularly preferred embodiment, the ring 128 is first attached to the feedthrough assembly 122 using a relatively high temperature soldering operation to form a subassembly. The completed subassembly is thereafter attached to the base deck 102 at a suitable point in the manufacturing process using a relatively lower temperature soldering operation. A shelf surface 150 of the sidewall 120 can be advantageously used to ensure proper mating of the ring 128 with the base deck 102.

Figure 5:
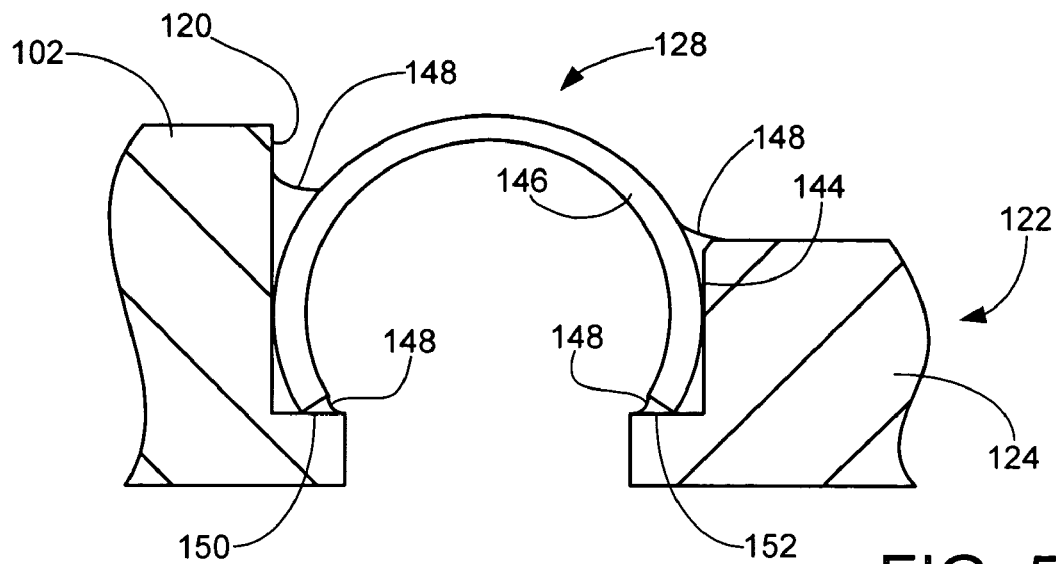
FIG. 5 provides an alternative construction for the elastic ring.

While FIGS. 3-4 illustrate a preferred configuration for the elastic ring 128, such is by no means limiting. For example, an alternative embodiment for the elastic ring 128 is provided in FIG. 5 which shows the ring 128 with a generally C-shaped cross-section. FIG. 5 further illustrates the peripheral edge 144 of the feedthrough assembly 122 to include a shelf surface 152 to advantageously aid the registration of the ring 128 with the assembly 122 during these operations.

Figure 6:
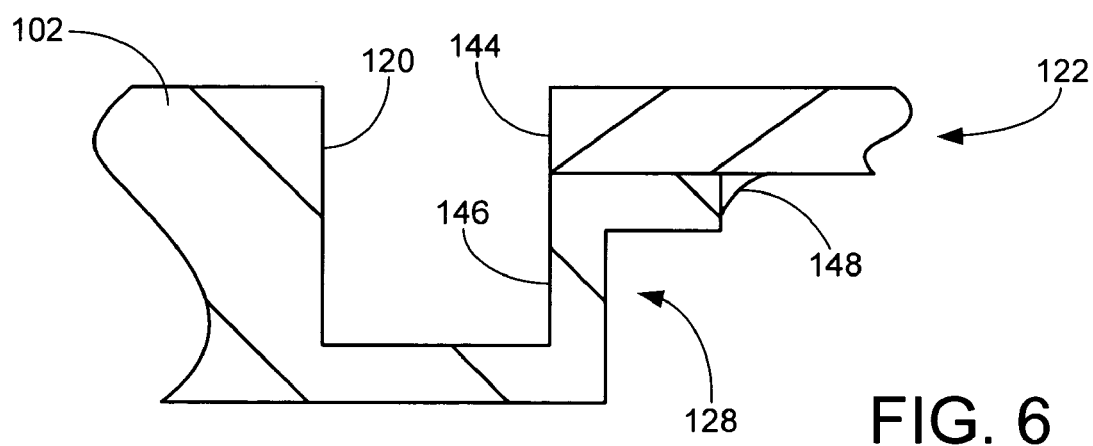
FIG. 6 provides another alternative construction for the elastic ring.

It is also not necessarily required that the elastic ring 128 comprise a separate part. For example, as shown in FIG. 6, the ring 128 is characterized as an inwardly directed flange that extends from the base deck 102 to couple with the feedthrough assembly 122. As before, spring deflection characteristics are enhanced by vertically extending segment 146 of the ring 128.

It will be noted in this embodiment that both the ring 128 and the base deck 102 are formed from a common material (e.g., aluminum), the base deck 102 has a first thickness adjacent the aperture, and the ring 128 has a second thickness less than the first thickness ("thickness" being defined as the cross-sectional distance from the interior to the exterior of the housing irrespective of axial direction).

Figure 7:
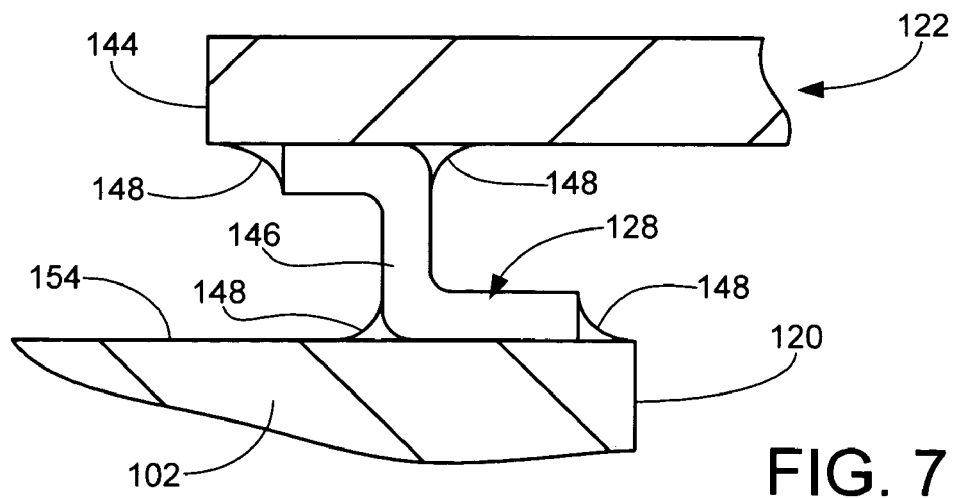
FIG. 7 provides yet another alternative construction for the elastic ring.

It is further not necessarily required that the elastic ring 128 fit down within the aperture in the base deck 102. Rather, as shown in FIG. 7, the feedthrough assembly 122 can be sized so as to fully span the aperture, in which case the elastic ring 102 is attached to a planar surface 154 of the base deck 102 surrounding the aperture. As before, the elastic ring 128 couples the peripheral edge 144 of the feedthrough assembly 122 to the base deck 102, and accommodates differential lateral expansion of the base deck 102 and the assembly 122 during thermal cycling. The ring 128 in FIG. 7 is shown to have a generally Z-shaped cross-sectional shape. The embodiment of FIG. 7 can be advantageous in smaller form factor designs where space constraints (length, depth, etc.) may prevent the recessing of the ring 128 into the aperture.

For purposes of the appended claims, the recited function of the "first means" will be understood to be carried out by the disclosed elastic ring 128 as illustrated in FIGS. 3-7. Mere solder, adhesive and/or epoxy connections between a housing member and an electrical feedthrough assembly fail to carry out the recited functions and are explicitly excluded from the definition of an equivalent.

The term "ring" will be understood consistent with the foregoing discussion to describe a circumferentially extending member, whether closed, substantially closed or overlapping, and may be of any desired shape including circular, rectangular, etc. The term "low permeable" will be understood consistent with the foregoing discussion to describe a characteristic whereby permeation or penetration of a fluid is substantially prevented, as in the environment of a hermetically sealed enclosure. The term "elastic" will be understood consistent with the foregoing discussion to describe a characteristic whereby a return is made to an original shape after application of a deformation force thereto.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

In addition, although the embodiments described herein are directed to a data storage device, it will be appreciated by those skilled in the art that the claimed subject matter is not so limited and various other environments can be utilized without departing from the spirit and scope of the claimed invention.

What is claimed is:

1. An apparatus comprising:
    a substantially planar housing member having an aperture, the housing member forming at least a portion of a hermetically sealed housing;
    an electrical feedthrough assembly extending adjacent the aperture; and
    an elastic ring which couples a peripheral edge of the electrical feedthrough assembly to the housing member to form a low permeable interface between said assembly and said member, wherein the housing member has a first coefficient of thermal expansion, wherein the electrical feedthrough assembly has a second coefficient of thermal expansion lower than said first coefficient, and wherein the elastic ring is configured to compensate for the difference between said first and second coefficients.

2. The apparatus of claim 1, wherein the housing member comprises opposing top and bottom surfaces, wherein the aperture is defined by an annular sidewall that extends between said top and bottom surfaces, and wherein the elastic ring is disposed in said aperture adjacent the sidewall.

3. The apparatus of claim 1, wherein the elastic ring has a third coefficient of thermal expansion between said first and second coefficients.

4. The apparatus of claim 1, wherein the elastic ring is formed to have an elongated cross-sectional shape at least one segment of which extends non-parallel with a longitudinal axis of the electrical feedthrough assembly.

5. The apparatus of claim 1, wherein the elastic ring is soldered to the housing member and to the electrical feedthrough assembly.

6. The apparatus of claim 1, wherein the elastic ring comprises an iron based alloy comprising nickel and cobalt.

7. The apparatus of claim 1, wherein the elastic ring comprises an inwardly directed flange of the housing member, wherein both the ring and the housing member are formed of a common material, wherein the housing member has a first thickness adjacent the aperture, and wherein the ring has a second thickness less than the first thickness.

8. The apparatus of claim 1, wherein the electrical feedthrough assembly fully spans the aperture and the elastic ring surrounds the aperture.

9. The apparatus of claim 1, wherein the apparatus retains a helium atmosphere of at least 95% concentration (w/w).

10. The apparatus of claim 1, wherein the housing is characterized as a housing of a data storage device comprising an internally supported data storage medium, and wherein the electrical feedthrough assembly facilitates electrical communication between said medium and an external device.

11. The apparatus of claim 1, wherein the elastic ring has a substantially S-shaped cross-sectional shape.

12. The apparatus of claim 1, wherein the elastic ring has a substantially C-shaped cross-sectional shape.

13. The apparatus of claim 1, wherein the elastic ring has a substantially Z-shaped cross-sectional shape.

14. An apparatus comprising an electrical feedthrough assembly configured to extend adjacent an aperture extending through a housing member of a hermetically sealed housing, and first means for coupling a peripheral edge of the electrical feedthrough assembly to the housing member and for accommodating a difference in the respective coefficients of thermal expansion of the housing member and the electrical feedthrough assembly.

15. The apparatus of claim 14, wherein the first means is characterized as an elastic ring which couples a peripheral edge of the electrical feedthrough assembly to the housing member.

16. The apparatus of claim 15, wherein the electrical feedthrough assembly has a second coefficient of thermal expansion lower than said first coefficient, and wherein the elastic ring has a third coefficient of thermal expansion between said first and second coefficients.

17. The apparatus of claim 12, wherein the elastic ring is soldered to the housing member and to the electrical feedthrough assembly.

18. The apparatus of claim 15, wherein the elastic ring comprises an iron based alloy comprising nickel and cobalt.

19. The apparatus of claim 14, wherein the first means comprises an inwardly directed flange of the housing member, wherein both the flange and the housing member are formed of a common material, wherein the housing member has a first thickness adjacent the aperture, and wherein the flange has a second thickness less than the first thickness.

20. The apparatus of claim 14, wherein the electrical feedthrough assembly fully spans the aperture and the first means extends about the aperture.

21. The apparatus of claim 14, wherein the electrical feedthrough assembly establishes a plurality of individual electrical signal transmission paths therethrough.

22. The apparatus of claim 14, wherein the apparatus retains a helium atmosphere of at least 95% concentration (w/w).

23. The apparatus of claim 14, wherein the housing is characterized as a housing of a data storage device comprising an internally supported data storage medium, and wherein the electrical feedthrough assembly facilitates electrical communication between said medium and an external device.

* * * * *

UNITED STATES PATENT AND TRADEMARK OFFICE
CERTIFICATE OF CORRECTION

PATENT NO. : 7,599,147 B2  Page 1 of 1
APPLICATION NO. : 11/198505
DATED : October 6, 2009
INVENTOR(S) : Neal F. Gunderson It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1013 days.

Signed and Sealed this

Twenty-eighth Day of September, 2010

David J. Kappos
*Director of the United States Patent and Trademark Office*